United States Patent [19]

Dugan

[11] Patent Number: 4,864,627
[45] Date of Patent: Sep. 5, 1989

[54] MICROPHONE MIXER WITH GAIN LIMITING AND PROPORTIONAL LIMITING

[76] Inventor: Daniel W. Dugan, 290 Napoleon St., Studio E, San Francisco, Calif. 94124

[21] Appl. No.: 928,418

[22] Filed: Nov. 7, 1986

[51] Int. Cl.[4] .............................................. H03G 3/00
[52] U.S. Cl. .................................... 381/108; 381/119; 381/106
[58] Field of Search ............... 381/107, 106, 119, 122, 381/92, 94, 95, 110

[56] References Cited

U.S. PATENT DOCUMENTS

| | | | |
|---|---|---|---|
| 3,992,584 | 11/1976 | Dugan | 381/107 |
| 4,249,042 | 2/1981 | Orban | 381/106 |
| 4,357,492 | 11/1982 | Campbell et al. | 281/107 |
| 4,442,546 | 4/1984 | Ishigaki | 381/106 |

Primary Examiner—Forester W. Isen

[57] ABSTRACT

A sound mixing control system applicable to recording, broadcast and sound reinforcement systems. The gain provided for each input channel through the system is monitored, and whenever the sum of all the gains exceeds a threshold the overall gain is reduced to limit the sum of the gains to the threshold. Simultaneously the output level of the mixer is measured, and whenever the level would otherwise exceed a threshold the gains of the input channels are reduced in proportion to their individual levels to limit the output level to the desired maximum. Signals may be divided into multiple frequency bands, processed in parallel and recombined.

33 Claims, 5 Drawing Sheets

MICROPHONE MIXER WITH GAIN LIMITING AND PROPORTIONAL LIMITING

BACKGROUND OF THE INVENTION

The present invention relates to signal control systems in general and in particular to a signal control system for controlling the transfer functions or gain and equalizatio of signals in a multi-microphone sound mixig system.

1. THE DIFFERENCE BETWEEN GAIN CONTROL AND LEVEL CONTROL

In understanding this system it is essential to distinguish between channel gains and signal levels in the chanels. For example, a channel may be set at a very high gain and yet have insignificant signal level in it, for example when a microphone channel is turned up but no one is speaking. Conversely, a channel may have a low gain but a very high signal level, as in the case of a microphone at the speaker of an electric guitar.

These two domains meet at the control point, for both level and gain are controlled by changing the gain of the channel. The operator will increase the gain of a channel until the microphones's sound appears in the mix at the artistically appropriate level. If system gain becomes excessive, as evidenced by feedback oscillation or excessive ambient noise, the gain of other channels may need to be reduced. At another time a sudden increase in signal level may be unpleasantly loud or exceed the output capability of the system. Then the operator must reduce the gain to control the level.

Each domain (gain & level) has an upper limit in the system. These limits are independent. It is the task of the operator to adjust the gains of the inputs so that the levels of the sound sources are aesthetically proportioned, while at the same time avoiding system overload by excessive overall level and avoiding feedback or noise in the case of excessive gain. These simultaneous goals are difficult to achieve and failures are common.

GAIN CONTROL

The performance of sound reinforcement systems is degraded by the feedback of sound from the loudspeaker(s) to the microphone(s). When the gain of any microphone in the system is raised to a certain threshold, increased reverberation and coloration of the sound is heard as the sound from the loudspeaker is amplified by the microphone at a high enough level to interfere with the original sound. Continuing to raise the gain above this point results in continuous oscillation of the system.

Where multiple microphones are used at the same time the performance of the system is further degraded by the increased pickup of sound from the loudspeaker and the sampling of more room resonances at different locations.

In broadcast and recording systems where loudspeaker feedback is not present, the practical maximum gain will be limited by the amplification of ambient noise. Undesirable changes in ambient noise pickup can result from raising and lowering the gains of different microphones.

Sound system performance can be greatly improved by the use of automatic microphone mixers as described in U.S. Pat. Nos. 3,814,856 (Dugan), 3,992,584 (Dugan), 4,489,442 (Anderson, Bevan, Schulein, Smith), and others. These processes reduce the number of open microphones to the minimum necessary at any time, and reduce the gain of the system as more microphones are opened to avoid feedback.

Performance of the existing automatic mixers is adequate for most speech reinforcement systems where the microphones are operated at approximately equal gains. Their control systems assume that the microphone input channels are adjusted for equal gains and consequently use of any microphone causes the same amount of gain adjustment to the system.

In live music and stage show sound reinforcement it is commonly the case that some microphones are operated at much higher gains than others. For example, the gain of a microphone channel amplifying stage dialogue from a distance of ten feet will be vastly higher than the gain of a channel picking up an electric guitar from a mike placed at the guitar speaker grille. An automatic mixer of one of the existing types would make an unnecessary gain reduction to the dialogue channel when the guitar started to play.

Furthermore, in live sound reinforcement it is often necessary to "reach" for a sound source that is too distant or too soft by increasing the gain of a microphone channel. Where many mikes are open even the most skilled operator may not be able to avoid running into feedback before enough level is obtained. In this situation a skilled operator will simultaneously reduce the gain of other channels by lowering their faders or lowering the master fader.

Similarly in broadcast or recording it is often difficult for an operator to maintain a constant pickup of ambient noise while adjusting the chains of different microphones up and down to achieve the desired levels.

LEVEL CONTROL (LIMITING)

Limiting is a well-known automatic process in which the gain of a signal channel is reduced by the amount necessary to prevent the level of the signal exceeding a certain threshold. In a sound reinforcement system, limiting may be applied to mixed output channels, to the individual input channels, or to both. There are disadvantages to limiting in either place using existing technology.

When the mixed signal is limited at the output and a signal exceeding the threshold occurs, softer components of the mix may be heard to "pump" down in level during the action of the limiter. For example, if a piano accompaniment is playing softly and then a singer begins at an unexpectedly high level, the output limiter will reduce the gain to bring the output level down to the threshold level. The piano will be heard to drop down in level when the voice begins, and will fade up again as the limiter recovers during pauses in the singing.

When limiters are used in the individual input channels these envelope intermodulation effects are avoided, but control of the output level becomes more difficult. When multiple individually limited signals are mixed, their peaks add randomly and the dynamic range of the output signal increases.

SUMMARY OF THE INVENTION

In this invention, two new functions termed herein "Gain Limiting" and "Proportional Limiting" are provided to assist in the control of sound mixing systems. These may be applied separately or in combination and may be used in manually operated systems or in combination with other automatic mixing techniques.

1. GAIN LIMITING

This invention includes an automatic gain adjusting system which is sensitive to the different gains of different input channels and assists the operator by preventing feedback and excessive ambient noise amplification even when the performance requires radical changes in the system gain. The system will respond to any change in the gain structure, whether from the attenuation of inputs by automatic mixing or from manual mixing changes, and perform only the minimum necessary modification of the gains to remain within the desired operating area. This function is called Gain Limiting.

Gain Limiting works as follows: The electrical gain of each input channel's signal path is monitored through all stages of the sound mixing equipment. This datum is adjusted by the setting of a calibration control which defines the feedback or ambient noise sensitivity of the individual input channel. The calibrated gain data from all input channels is summed and the sum compared with a threshold value. If the total system gain exceeds the threshold the overall gain of the system is reduced to the threshold value while the relative gains of all the channels are maintained. Note that this function is completely independent of the signal levels which may occur in the system, and that the function does nothing most of the time while the overall gain threshold is not exceeded.

2. PROPORTIONAL LIMITING

This invention includes a limiting system which senses the signal level above a threshold at the output, and applies the corrective gain reduction only to the input or inputs which cause that excessive level. This function is called Proportional Limiting.

Proportional Limiting works as follows: The output level is compared to a limiting threshold and an error signal is generated. For each input channel the ratio of the level in that channel to the level of the sum of all channels is calculated as in a speech automatic mixer, for example U.S. Pat. No. 3,992,584. In this case the resulting set of data is not used to control the gains of the channels. Instead the pattern of levels is used as a mask to steer and proportion the application of the error signal as a gain reduction signal to the individual input channels.

For example, if only one input is active and the signal exceeds the limiting threshold at the output, an error signal will be generated and input to the proportioning stage which will steer it 100% to the single active input. Imagine then that the louder source stops momentarily and softer sounds appear at several other inputs. When the loud voice begins again, the gain thru to the output of the softer voices will not be noticeably affected while the gain of the input which is causing the excessive output level will be subjected to the desired limiting action.

OBJECTS OF THE INVENTION

A principal object of the present invention is a system for amplifying and mixing a number of microphones in a sound reinforcement system so that the operator is assisted in keeping the system gain below feedback and the system levels below distortion or discomfort.

Another object of the present invention is to provide means for mixing a number of microphones in a broadcast or recording system with automatic limitation of the amount of ambient noise present in the mix.

A further object of the present invention is to provide a system for altering the transfer function or equalization of a sound system to reduce the potential for feedback, making the alteration automatically only at the time when it is needed and restoring the system to high-fidelity standards when the demand for high gain ceases.

Another object of the present invention is to provide means for applying limiting to a group of signals being mixed so that modulation of the envelopes of signals in the mix by the envelopes of other signals is reduced.

Another object of the invention is to provide the above-mentioned features in a device which is easy to install and operate, requires no special wiring, can be combined with automatic mixing and is compatible with all other standard sound system components.

The above and other objects, features and advantages of the invention will be apparent from the detailed description of the accompanying drawings.

DETAILED DESCRIPTION

Figure 1:
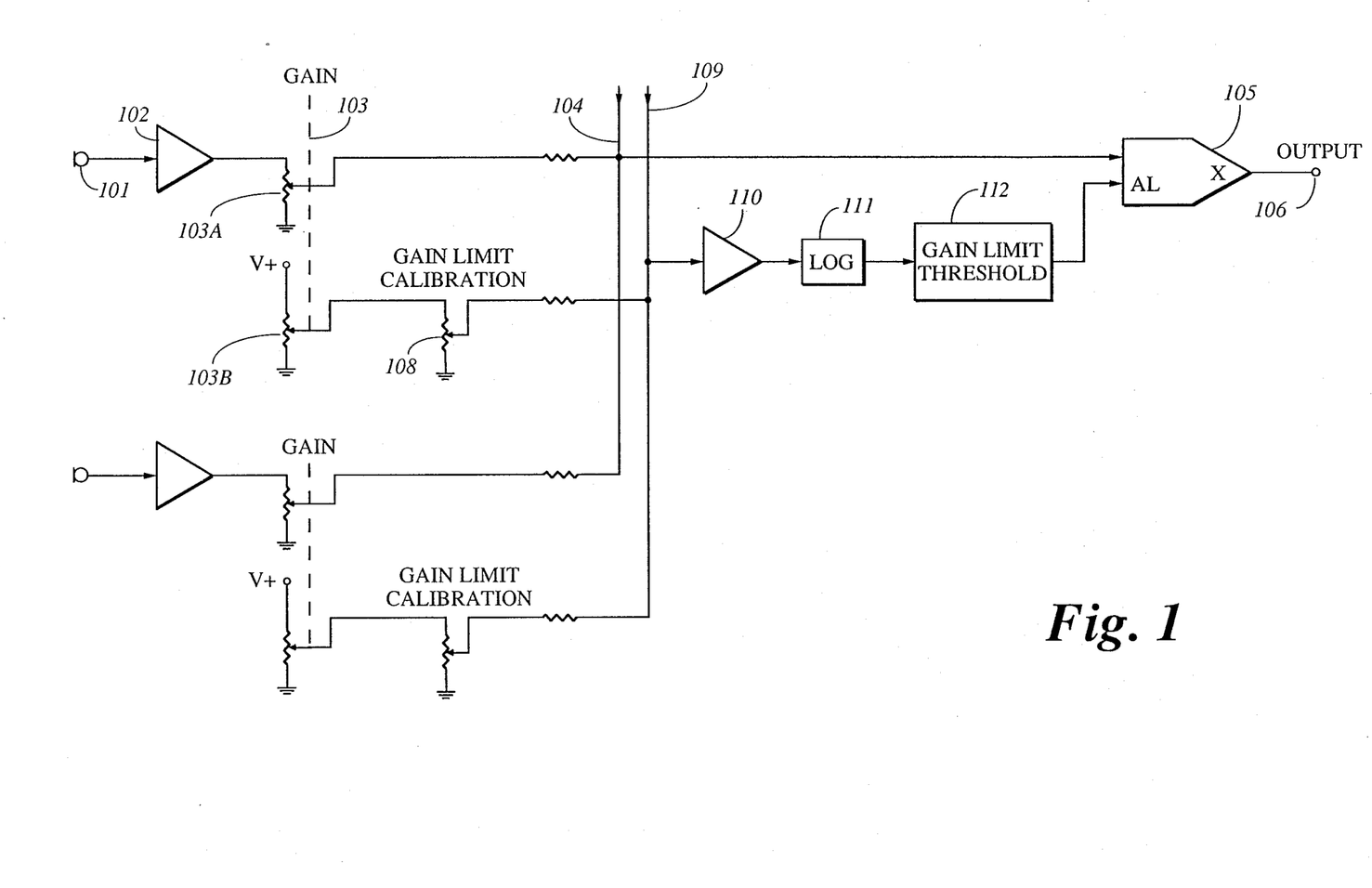
FIG. 1 is a block diagram of a microphone mixer made according to the invention with feed-forward Gain Limiting.

FIG. 1 is a block diagram of a system with manual controls and only the Gain Limiting function. This simple system is a useful embodiment of the invention which illustrates the operation of Gain Limiting.

A number of microphones 101 receive sound from various sources. Preamplifiers 102 amplify the signals from the microphones. The audio sections 103A of gain control potentiometers 103 attenuate the signals from the outputs of the preamplifiers. Subsequently the signals from the two inputs shown and any additional inputs are summed into mixing bus 104. The analog multiplier or voltage controlled amplifier 105 is provided with a virtual ground summing audio input, and a gain control input with an antilogarithmic (linear decibel) response. The summed currents from the mixing bus 104 flow into the summing input of multiplier 105 and its output provides the signal to the output terminal at 106. This signal may drive an amplifier and loudspeaker, or recording or broadcasting apparatus.

Each gain control potentiometer 103 has dual mechanically-coupled sections having identical resistance tapers. The second section of each, 103B, provides a DC voltage analog of the setting of the respective gain control and thus an analog of the gain applied to the input signal. The voltages so produced are further modified by gain limit calibration control potentiometers 108. The outputs of the gain limit calibration controls of all inputs are summed into bus 109, from which the combined DC current flows into the virtual ground summing input of amplifier 110. The DC output of 110 is logarithmically compressed by log amplifier 111 and applied to the input of gain limit threshold stage 112. An example of a suitable circuit for 112 is found in FIG. 6, described later.

When the overall system gain as represented by the DC input voltage to stage 112 is below a threshold set by the gain limit threshold control in stage 112, the output of stage 112 remains constant at the voltage required to produce normal gain in multiplier 105. When the gain as represented by the DC input voltage to stage 112 exceeds the threshold, its output voltage will change to a value providing the appropriate gain reduction in multiplier 105 to limit overall system gain to the desired maximum value.

To adjust this mixer for use, begin with all gain controls 103 at minimum (down or counter-clockwise), gain limit calibration controls 108 at the grounded end (clockwise), and the threshold control in stage 112 at maximum (clockwise). While someone speaks at microphone 101, raise gain control 103 to the point where maximum gain is found, either by the onset of feedback or the maximum tolerable amplification of ambient noise. Adjust the gain limit calibration control 108 and the gain limit calibration control in stage 112 until gain reduction just begins to occur in multiplier 105. Now whenever gain control 103 is raised beyond the maximum gain point, the overall gain will remain constant at that gain by the attenuating action of multiplier 105 precisely complementing every increase of gain from gain control 103.

Repeat this adjustment for each input in the system, finding a suitable constant setting of the threshold control in stage 112 that provides the appropriate range of adjustment for the individual gain limit calibration controls 108 to accommodate the different noise and feedback sensitivities of the various microphones.

In operation the gain of the system will be completely under manual control as long as the overall gain remains below the Gain Limiting threshold. When the combined gain of multiple inputs exceeds the threshold the overall gain will be reduced by multiplier 105 thus maintaining the desired proportional mix of the inputs. "Reaching" for a sound needing maximum gain will be easily accomplished by raising the gain control of that input. When the gain limit threshold is reached the gain of that input will not increase any more and the rest of the mix will start to go down to make room for it. This is similar to the action of an expert mixer with the added advantages of accuracy in maintaining the proportions of the mix and a perfect return to the previous conditions when the demanding input is returned to a more normal gain.

Figure 2:
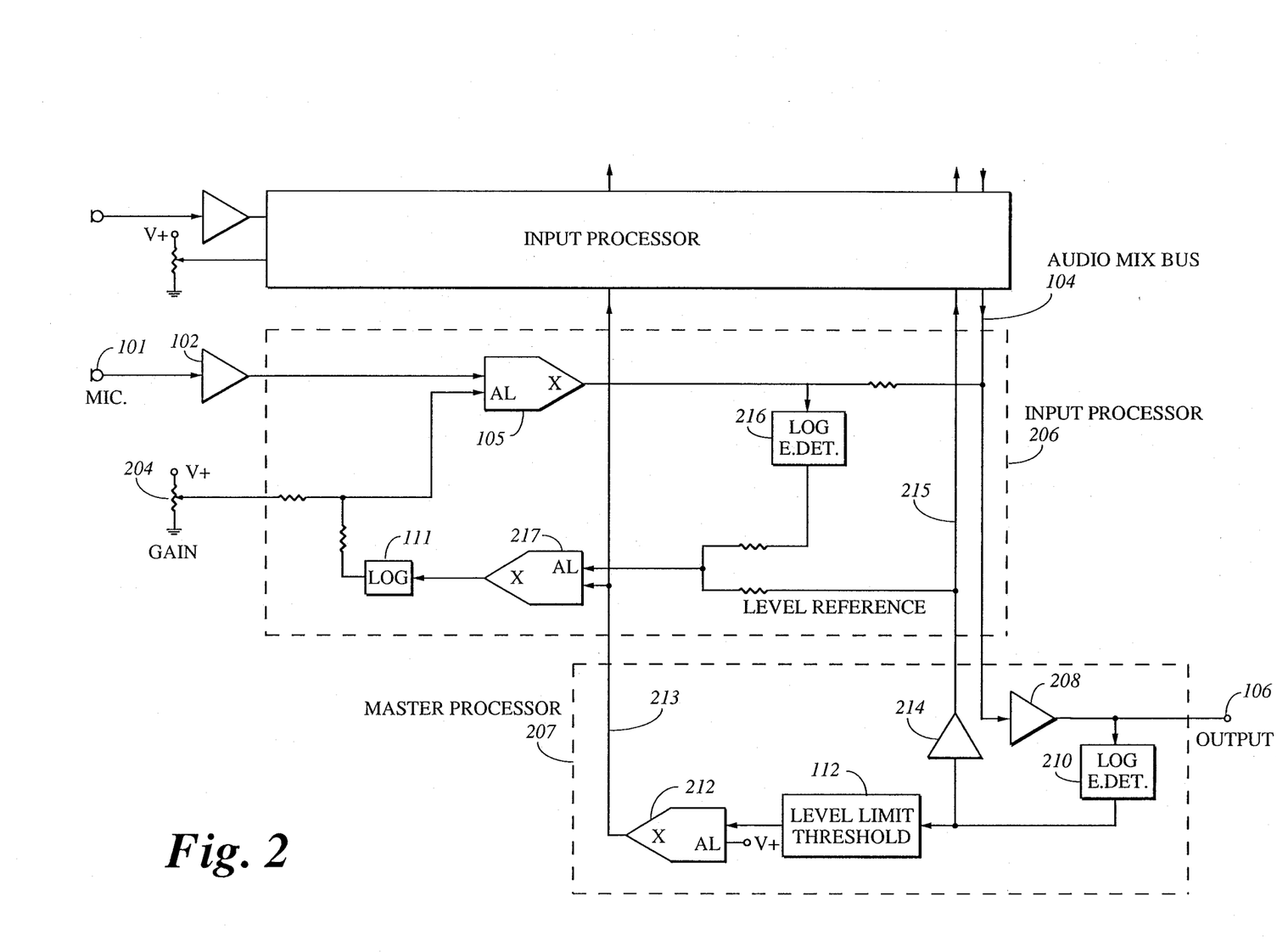
FIG. 2 is a block diagram of a microphone mixer made according to the invention with Proportional Limiting.

FIG. 2 is block diagram of a simple microphone mixer illustrating a practical embodiment of the Proportional Limiting function.

Microphone 101 is a typical one of multiple microphones in the system. Its signal is received and amplified in preamplifier 102, whose output is connected to the audio input of multiplier or voltage controlled amplifier 105. Gain control potentiometer 204 supplies a DC control voltage to control the gain of the input channel via the antilog control input of multiplier 105.

The output of multiplier 105 is summed with the respective outputs from all the other inputs in audio mix bus 104. The combined audio current sinks into the virtual ground summing input of amplifier 208, which provides an output signal to output terminal 106, whence it may be recorded or further amplified for driving loudspeakers.

The output signal level of the system is monitored by log envelope detector 210, of the type commonly used in automatic microphone mixers. The resulting DC analog voltage is analyzed by level limit threshold stage 112 which provides an output signal proportional to the amount the level of the signal exceeds the threshold. This signal is converted back to linear scaling by antilog amplifier 212, which produces the system level error signal distributed on level error bus 213. The voltage on bus 213 is zero when the output level is below threshold. In addition, the output of log envelope detector 210 is inverted by amplifier 214 and distributed by level reference bus 215. The interconnected combination of amplifier 208, log envelope detector 210, level limit threshold stage 112, antilog amplifier 212 and inverting amplifier 214 comprises master processor 207.

The output of multiplier 105 is also connected to log envelope detector 216, which matches the characteristics of log envelope detector 210. The output of log envelope detector 216 and the level reference signal from bus 215 are summed at the antilog input of multiplier 217. Since these signals are logarithmically scaled, the reference signal has been inverted at 214, and the difference of two logarithmic quantities is a ratio, the resulting control signal at the input of 217 represents the ratio of the output level of multiplier 105 to the output level of summing amplifier 208, or the ratio of the input channel signal to the sum of all the inputs. Multiplier 217 is biased so that zero volts at the antilog input (ratio of 1/1) produces unity gain from its linear input to its output. Multiplier 217 functions similarly to the channel voltage controlled amplifier in a speech automatic mixer (U.S. Pat. No. 3,992,584) but instead of controlling the channel signal it controls the distribution of the level error signal from bus 213.

The output of multiplier 217 is converted to logarithmic scaling by log amplifier 111, and summed with the manual control voltage at the antilog input of multiplier 105. This completes a negative feedback loop of the signal amplitude envelope which is activated whenever the output signal exceeds the desired threshold level.

Multiplier 105, log envelope detector 216, multiplier 217, log amplifier 111 and their connections comprise the input processor 206. Input processor 206, along with microphone 101, preamplifier 102 and gain control 204, may be replicated for as many inputs as are needed.

In operation, while the output level is below the limiting threshold the gains of multipliers 217 will continuously follow the pattern of the levels of the inputs, but no gain changes will result in multipliers 105 since bus 213 is at zero volts. When an excessive level appears at the output 106, a level error signal will appear on bus 213 and this signal will be proportioned to the various inputs in accordance with the pattern of their levels at the moment, causing corrective gain reduction to occur in the input channels in proportion to their contribution to the problem.

Figures 3, 4, 5:
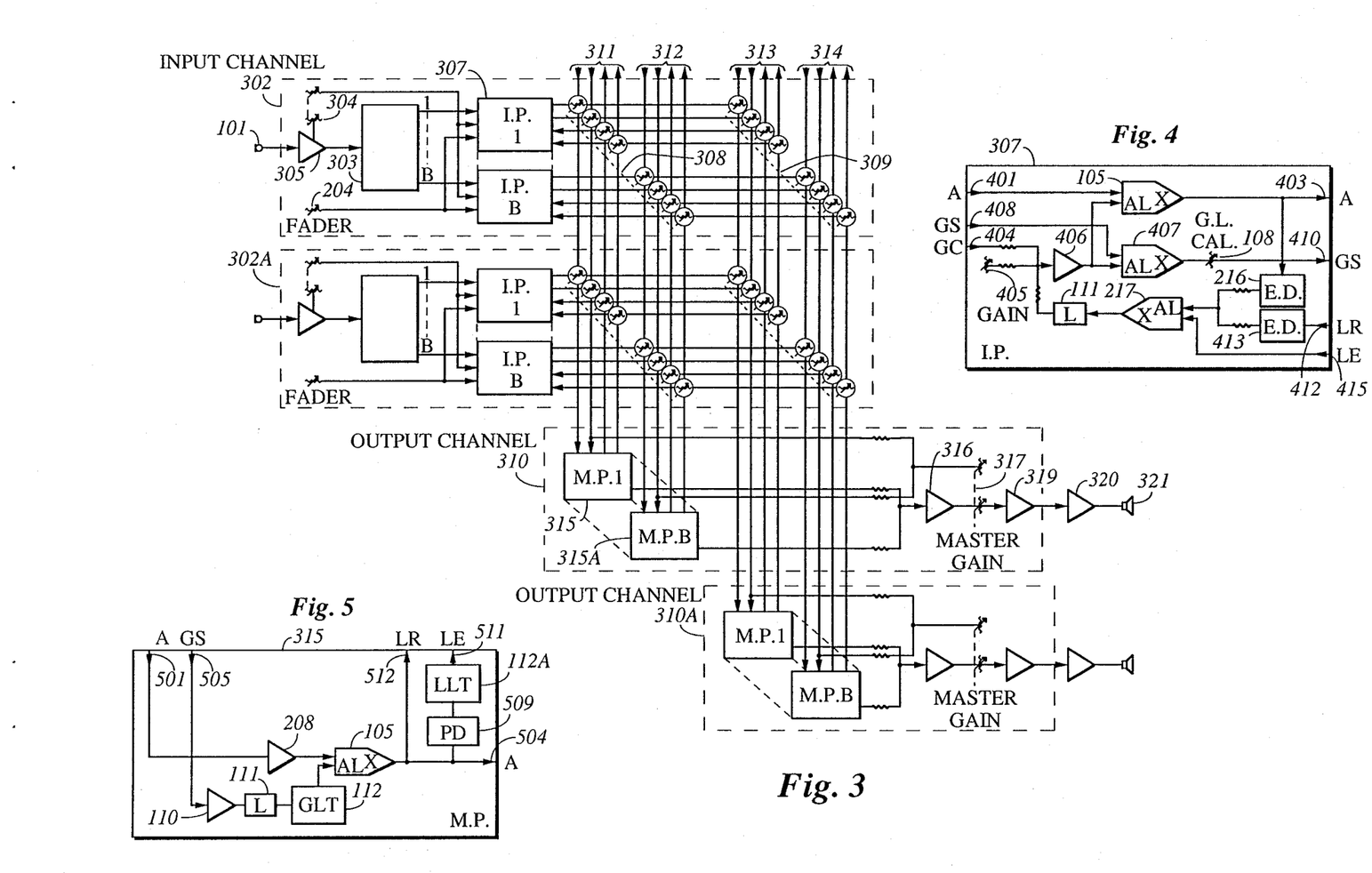
FIG. 3 is block diagram of a microphone mixer incorporating the invention, with Gain Limiting and Proportional Limiting, multiple input channels, processing in frequency bands, and distribution to multiple output channels.
FIG. 4 is a block diagram detailing the Input Processor stage of FIG. 3.
FIG. 5 is a block diagram detailing the Master Processor stage of FIG. 3.

FIG. 3 is a block diagram of an embodiment of the invention in which the Gain Limiting and Proportional Limiting functions are combined in a system with parallel processing of multiple frequency bands and distribution to multiple output channels. Such a system would typically have from eight to 48 inputs of which two are shown, from four to 256 frequency bands of which two are shown, and from two to 48 outputs of which two are shown in the drawing.

Microphone 101 is connected to a typical input channel at 302. Input channel 302 includes preamplifier 303, band dividing filter 305, input processors for each frequency band of which 307 is a typical one, and distribution matrix controls 308 and 309. The gain of preamplifier 303 is adjusted by gain trimming control 304, a dual element variable resistor, one element directly affecting the gain of the preamplifier and the other element providing a DC gain sense signal analogous to the setting of the gain trimming control.

Band dividing filter 305 separates the audio signal into a set of complementary frequency band limited signal components. Fader control 204 provides a master DC gain control signal for the input channel which is conducted to the gain control inputs of the input processors 307.

A set of input processors 307, one for each frequency band, provide the computation and control functions as illustrated in detail in FIG. 4, described later. Input processor 307 has an audio signal input, a gain sense input for the DC gain sense signal from gain trimming control 304, and a gain control input for the DC gain control signal from fader 204. Input processor 307 has an audio signal output and a gain sense output providing a DC analog of the electrical gain applied to the audio path up to that point. It also has inputs for the level error and level reference signals which feed back from later stages.

The outputs of the input processors 307 in input channel 302 are directed to the desired output channels in parallel groups by distribution matrix controls 308 &. 309. In the case of a system with only two output channels, controls 308 & 309 would be mechanically coupled in opposite directions comprising a panpot. In systems with more output channels controls 308 & 309 would be potentiometers, voltage controlled amplifiers or switches. Control 308 is made up of coupled groups of four elements, one group for each frequency band, which vary resistance, gain or switch position together. The two groups of four control elements shown in control 308 correspond to the two frequency bands shown in input channel 302, with more groups implied for the frequency bands not shown. Control 308 controls the signal transmission to, and feedback signals from, output channel 310. Control 309 controls the signal transmission to, and feedback signals from, output channel 310A. System bus groups 311 and 312 combine the signals of all input channels distributed to output channel 310 and distribute the feedback signal from output channel 310 to the input channels. Similarly, control 309 distributes the signals of input channel 302 via system bus groups 313 and 314 to another output channel 310A, and bus groups 313 and 314 distribute the feedback signals from output channel 310A to all the inputs, including input channel 302 via control 309. Another input channel 302A and as many more input channels as are desired are made in the same way.

Output channel 310 comprises a set of master processors 315, one for each frequency band, followed by summing amplifier 316, master gain control 317 and line amplifier 319. Details of master processor 315 may be found in FIG. 5. Master processor 315 receives audio and gain sense signals from, and returns level reference and level error signals to, system bus group 311. Master processor 315A similarly services another frequency band via bus group 312. The audio outputs of master processors 315, 315A and those corresponding to the frequency bands not shown are all summed into a virtual ground input of amplifier 316. At this point the frequency band components are recombined to produce a normal audio signal.

Master gain control 317 includes a gain sense DC output which feeds back a DC voltage analog of the gain setting of the control to the gain sense lines of all the bus groups (311, 312 shown) that terminate in output channel 310. Line amplifier 319 provides level and impedance matching to make an output signal suitable for external use, typically by a power amplifier 320 and loudspeaker 321. Output channel 310A and all as many other output channels as may be desired are made in the same way.

FIG. 4 is a block diagram detailing the input processor circuitry referred to in FIG. 3 as 307. The signal at audio input 401 is amplified or attenuated by multiplier 105, from which the signal proceeds to audio output 403. Gain control input 404 is provided to receive DC gain control signals. Local gain control 405 produces a DC gain control signal also. These control signals are summed in amplifier 406 whose output sends the resulting control signal to multiplier 105 and also to gain sense multiplier 407. Multipliers 105 and 407 always have identical gains. Gain sense input 408 receives a DC gain sense signal which is connected to the main input of multiplier 407. Calibration control 108 provides an adjustment by the installer or operator to make the gain limiting action correspond with the sensitivity of the particular microphone and its position. Gain sense output 410 provides a linearly scaled DC voltage analog of the gain of the channel elements associated with the input processor.

The audio output signal at the output of multiplier 105 is also monitored by log envelope detector 216, which produces a log scaled DC voltage analogous to the level of the audio signal. Level reference input 412 receives an audio signal for log envelope detector 413, which is made to produce an identically scaled output as 216 but of the opposite polarity. When these voltages are summed at the antilog control input of multiplier 217, the difference of the logs represents the ratio of the levels of the audio signals at audio output 403 and level reference input 412. Level error input 415 receives a linearly scaled DC control voltage which is then modified by the gain of multiplier 217. Multiplier 217 is biased so that it has unity gain when the antilog control input is zero. The result is that the level error signal is passed at full value by multiplier 217 only when the signals at audio output 403 and level reference input 412 are equal in level. When the level at 403 is lower than the level at 412 multiplier 217 will attenuate the level error signal correspondingly. Log amplifier 111 converts the level error signal to a log scale suitable for summing in addition to the other two gain control signals summed by amplifier 406.

FIG. 5 is a block diagram of the master processor stage referred to in FIG. 3 at 315 and repeated for each band in each output channel of the system in FIG. 3. Audio input 501 conducts an audio mix bus to summing amplifier 208. The audio signal is then passed through multiplier 105 and is output at 504. Gain sense input 505 conducts a linear control voltage mixing bus to summing amplifier 110. The resulting control voltage is converted to log scaling by log amplifier 111 and compared with a threshold in gain limit threshold stage 112. When the gain sense signal exceeds the threshold, a control voltage analogous to the required amount of gain reduction is produced at the output of threshold stage 112 and is applied to the antilog control input of multiplier 105, resulting in the appropriate amount of gain reduction in the channel. The output of multiplier 105 is also monitored by peak detector 509 which produces a linearly scaled DC control voltage analog of the amplitude envelope maxima of the signal observed at output 504. Level limit threshold stage 112A compares this to a threshold value and produces a level error signal analogous to the excessive level for transmission to other stages on a level error bus driven from output 511. Another audio output from multiplier 105 is provided at 512 to drive a level reference bus for the proportional limiting process.

Figure 6:
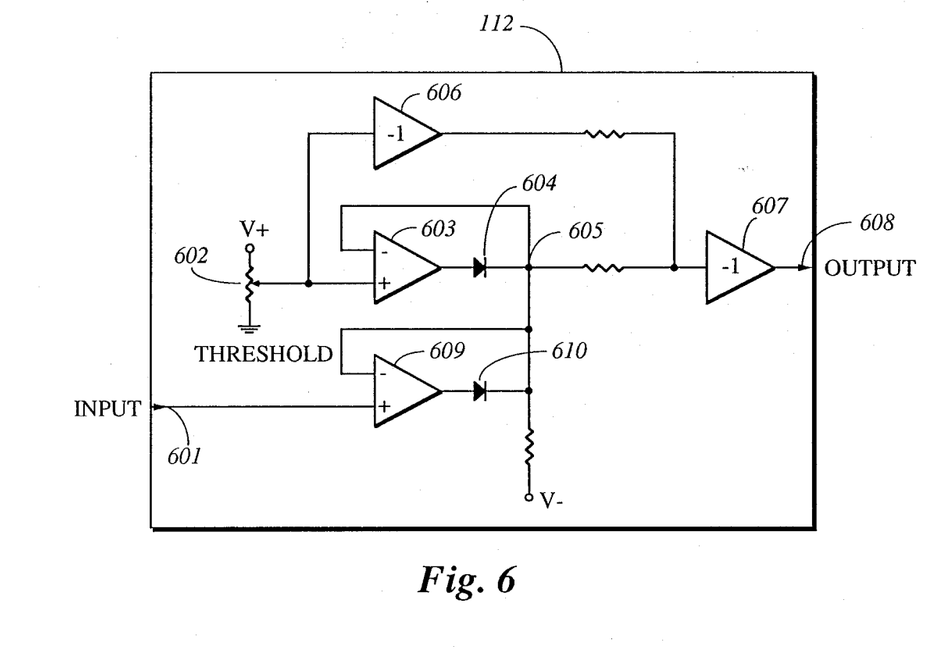
FIG. 6 is a schematic diagram of a typical Limit Threshold circuit used in FIGS. 1, 2, 5 and 7.

FIG. 6 is a schematic diagram of an example of a limit threshold circuit useable as 112 in FIGS. 1, 2, 4, 5 and 7. It is a conventional "linear or" circuit with a normalized output level. When the voltage at the input 601 is below the threshold voltage set on threshold control 602, amplifier 603 turns diode 604 on, and the threshold voltage appears at node 605. Inverting amplifier 606 makes a negative copy of the threshold voltage which is summed by inverting amplifier 607 with the voltage at node 605 to produce a zero volts output. When the voltage at input 601 is above the threshold, amplifier 609 turns on diode 610 and the voltage at node 605 rises to the level of input 601. Subtraction of the threshold and inversion in amplifier 607 produce a negative-going control voltage at output 608 equal to the amount the input exceeds the threshold.

Figure 6A:
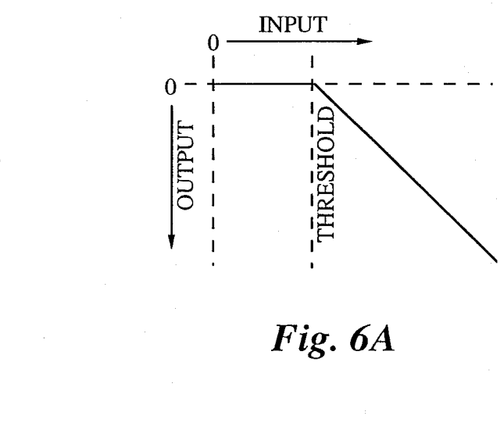
FIG. 6A is a graphical representation of the input-output function of the Limit Threshold circuit shown in FIG. 6.

FIG. 6A is a graphical representation of the input-output transfer function of the limit threshold circuit shown in FIG. 6.

For the following examples of system operation, refer to FIG. 3. Consider the condition when ambient noise is present at microphones 101, faders 204 are at a normal −10 dB position, distribution control 308 is up full and control 309 is in the fully attenuated position, master gain control 317 is at a normal −10 dB position, and the gain limit calibration controls in input processors 307 have been set as described above for FIG. 1, for each frequency band in each input. Assume that the system gain in this condition is just below the threshold of feedback. Now if people speak at any of microphones 101 their voices will be reinforced by the output of loudspeaker 321. The speech signals will be divided into frequency bands and recombined without alteration, and the system will perform as a conventional mixer.

When the operator, desiring more gain for one microphone 101, raises the corresponding fader 204, in some frequency bands the system gain will then exceed the feedback threshold. The gain sense outputs of all the input processors 307 in input channel 302 will rise with the fader, and depending on the gain limit calibration control settings in the input processors 307 and the gain limit threshold settings in the master processors 315, some of the master processors 315 in output channel 310 will reduce gain in their frequency bands, applying an anti-feedback equalization to the system only to the degree needed.

In the case of excessive level at the output, master processors 315 will produce signals on their level error bus outputs (see 511 in FIG. 5) when the signal levels of the corresponding frequency bands at their outputs exceed their level limit thresholds as set by the operator. The level error signals from the bus will be distributed back to those input channels feeding that output via controls 308, and will be steered to act on the inputs causing the excessive level by the pattern of levels detected in the input processors 307.

When input channels are distributed to more than one output, as in the case when both controls 308 and 309 are up, the gain sense signals are also distributed in parallel, and the returning level reference and level error buses are proportioned accordingly to the inputs by the corresponding sections of the same controls.

Figure 7:
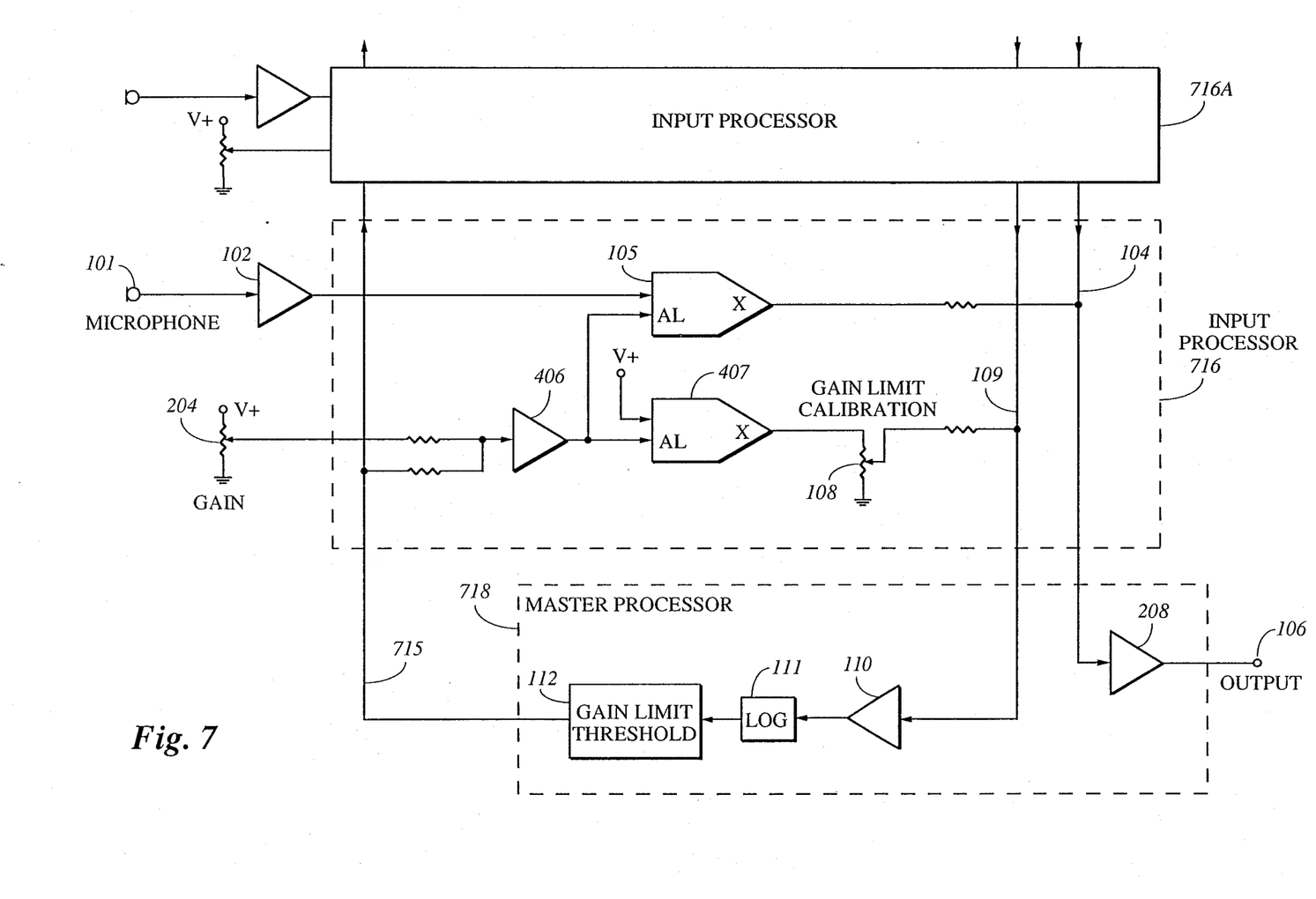
FIG. 7 is a block diagram of a microphone mixer incorporating the invention with feedback Gain Limiting.

FIG. 7 shows a microphone mixer including a simple Gain Limiting system as in FIG. 1, but configured in a feedback topology. Signals from microphone 101 are connected to preamplifier 102 whose output continues to multiplier 105, the only gain control element in the signal path. Audio mixing bus 104 collects audio signal currents from all the inputs and conducts them to the virtual ground summing input of amplifier 208. The output of amplifier 208 proceeds to output terminal 106.

Fader gain control 204 makes a DC voltage which is buffered by amplifier 406 and therefrom distributed to the control inputs of both multipliers 105 and 407, so that their gains are identical. Multiplier 105 controls the audio path whereas multiplier 407 produces a DC gain sense signal used for the Gain Limiting process. Gain limit calibration control 108 adjusts the gain sense signal so that inputs of varying sensitivity can be accommodated. Gain sense bus 109 sums the gain sense currents from all inputs and conducts the resulting current to the virtual ground summing input of amplifier 110. Log amplifier 111 converts the gain sense signal to a logarithmic scale. Gain limit threshold stage 112 produces an output only when the gain sense signal is above its threshold. The resulting gain limiting control signal is distributed by bus 715 to all the inputs, where the control signal is summed with the control signal from the local fader into amplifier 406.

Items 105, 406, 407, 108 and their connections comprise input processor 716, the same circuitry being repeated at 716A and in as many additional channels as are needed.

In operation, the gain of multiplier 105 is constantly controlled by gain control 204 except when the gain of this input or any other input or combinations of inputs is raised to the gain limit threshold defined in stage 112. Only when the gain threshold has been exceeded does a negative feedback loop exist around amplifier 407, gain limit calibration control 108, bus 109, amplifier 110, log amp 111, gain limit threshold stage 112, bus 715 and amplifier 406, which limits further gain increases.

The systems expressed by the Figures are but a few of many possible configurations of this invention which persons skilled in the art may wish to create.

The control functions may be obtained with either feedback or feed-forward types of circuits, and the computations may be performed equally well by means of analog or digital computing circuitry.

Other configurations and applications of the system described which fall within the spirit and scope of the present invention will undoubtedly occur to those skilled in the art.

Accordingly, the description herein is provided only for purposes of illustration and is not intended to limit the invention to that which is described, but rather the scope of the invention is intended to be defined by reference to the claims hereinafter provided.

What is claimed is:

1. In a system for combining audio signals from a plurality of sources:
   a plurality of input channels having controlled transfer functions to which respective ones of the audio signals are applied,
   means for combining the audio signals from the input channels to provide an audio output signal,
   means for modifying the overall transfer function of the system,
   control means for setting limits to parameters of the overall transfer function,
   means for monitoring the overall transfer function of the system,
   means responsive to said monitoring means for adjusting said overall transfer function modifying means so that the overall transfer function remains within the limits set by said control means for setting limits,
   means responsive to the magnitude of the output signal for generating a level error signal corresponding to the amount the magnitude of the output signal exceeds a predetermined limit, and
   means responsive to the level error signal for adjusting the transfer function of each input channel in proportion to the relative magnitude of the audio signal at the output of the input channel.

2. The system of claim 1 including at least one digital audio signal processor.

3. The system of claim 1 wherein each of the input channels includes transfer function control means including an audio frequency equalizer.

4. The system of claim 1 including means having a controlled transfer function for processing the audio output signal.

5. The system of claim 1 wherein the means for modifying the overall transfer function includes means for adjusting the transfer functions of the input channels.

6. In a system having an overall gain for combining audio signals from a plurality of sources;
   a plurality of gain controlled input channels to which respective ones of the audio signals are applied,
   means for combining the audio signals from the input channels to provide an audio output signal,
   means for adjusting the overall gain of the system,
   threshold control means for setting a maximum value for the overall gain of the system,
   means for monitoring the gains of the input channels and the overall gain of the system,
   means responsive to said monitoring means and said threshold control means for controlling said means for adjusting the overall gain of the system to reduce the overall gain when needed to prevent the overall gain from exceeding said maximum value,
   means responsive to the magnitude of the output signal for generating a level error signal corresponding to the amount the magnitude of the output signal exceeds a predetermined limit, and
   means responsive to the level error signal for adjusting the gains of the input channels in proportion to the relative magnitudes of the audio signals at the outputs of the input channels.

7. The system of claim 6 including at least one digital audio signal processor.

8. The system of claim 6 wherein the means for adjusting the overall gain of the system includes means for adjusting the gain of the system subsequent to the combining means.

9. The system of claim 6 wherein the means for adjusting the overall gain includes means for adjusting the gains of the input channels.

10. In a system for processing audio signals
    a plurality of input channels each including means for receiving an audio signal and dividing the audio signal into a predetermined number of components,
    an input processor for each component in each channel, each of said input processors including gain control means and means for monitoring the gain applied to the signal, and
    for each component a master processor including
       means for combining the corresponding components of different ones of the audio signals from the input processors,
       means responsive to the gain monitoring means in the corresponding input processors for adjusting the overall gain applied to each component to maintain the overall gain applied to the component below a predetermined maximum gain.
       means responsive to the magnitude of the signal at the output of the master processor for generating a level error signal corresponding to the amount the magnitude of the output signal of the master processor exceeds a predetermined maximum level, and
       means responsive to the level error signal for adjusting the gains of the respective input processors in proportion to the relative magnitudes of the audio signals at the outputs of the input processors, and
    means for combining the outputs of the master processors to provide an audio output signal.

11. The system of claim 10 wherein the means for dividing then input signals into components includes frequency sensitive means for dividing input signals into components of different frequency ranges.

12. The system of claim 10 including at least one digital audio signal processor.

13. The system of claim 10 in which the means for adjusting the overall gain applied to each component to maintain the overall gain applied to that component below a predetermined maximum gain includes gain control means in each input processor.

14. The system of claim 10 in which the means for adjusting the overall gain applied to each component to maintain the overall gain applied to that component below a predetermined maximum gain includes gain control means in each master processor.

15. In a system for combining audio signals from a plurality of sources:
    a plurality of input channels having controlled transfer functions to which respective ones of the audio signals are applied,
    means for combining the audio signals from the input channels to provide an audio output signal,
    means for modifying the transfer functions of the input channels to modify the overall transfer function of the system, control means for setting limits to parameters of the overall transfer function,
means for monitoring the overall transfer function of the system, and
means responsive to said means for monitoring and said control means to adjust said means for modifying the overall transfer function when necessary to maintain the overall transfer function within said limits.

16. The system of claim 15 wherein the means for modifying the overall transfer function includes means for adjusting the transfer functions of the input channels.

17. The system of claim 15 including at least one digital audio signal processor.

18. The system of claim 15 wherein each of the input channels includes transfer function control means including an audio frequency equalizer.

19. The system of claim 15 including means having a controlled transfer function for processing the audio output signal.

20. In a system having an overall gain for combining audio signals from a plurality of sources:
a plurality of gain controlled input channels to which respective ones of the audio signals are applied,
means for combining the audio signals from the input channels to provide an audio output signal,
means for adjusting the overall gain of the system,
threshold control means for setting a limit to the overall gain of the system,
means for monitoring the gains of the input channels and the overall gain of the system, and
means responsive to said monitoring means and said threshold control means for controlling said means for adjusting the overall gain of the system when necessary so that the overall gain of the system does not exceed said limit.

21. The system of claim 20 wherein the means for adjusting the overall gain of the system includes gain control means subsequent to said combining means.

22. The system of claim 20 including at least one digital signal processor.

23. The system of claim 20 wherein the means for adjusting the overall gain includes means for adjusting the gains of the input channels.

24. In a system for combining audio signals from a plurality of sources:
a plurality of gain controlled input channels to which respective ones of the audio signals are applied,
means responsive to the magnitudes of the outputs of the input channels to provide a feedback steering signal for each respective channel proportional to the relative magnitude of the output of that channel,
means for combining the audio signals from the input channels to provide an audio output signal,
means responsive to the magnitude of the output signal for generating a level error signal corresponding to the amount the magnitude of the output signal exceeds a predetermined limit, and
means responsive to the level error signal and the feedback steering signals for reducing the gains of the respective input channels in proportion to the relative magnitudes of the audio signals at the outputs of the input channels.

25. The system of claim 24 including at least one digital audio signal processor.

26. In a system for processing audio signals:
a plurality of input channels each including means for receiving an audio signal and dividing each input signal into a predetermined number of components, and
an input processor for each component in each input channel, each of said input processors including gain control means and means for monitoring the gain applied to the component,
for each component a master processor including
means for combining the corresponding components of different ones of the audio signals from the input processors,
means responsive to the means for monitoring the gain applied to the signal component for adjusting the overall gain applied to each component to maintain the overall gain applied to each component below a predetermined gain, and
means for combining the outputs of the master processors to provide an audio output signal.

27. The system of claim 26 wherein the means for dividing the input signals into components includes frequency sensitive means for dividing input signals into components of different frequency ranges.

28. The system of claim 26 including at least one digital audio signal processor.

29. The system of claim 26 wherein the means for adjusting the overall gain applied to each component include gain control means in each master processor.

30. The system of claim 26 wherein the means for adjusting the overall gain applied to each component include gain control means in each input channel.

31. In a system for processing audio signals:
a plurality of input channels each including means for receiving an audio signal and dividing the audio signal into a predetermined number of components,
an input processor for each component in each channel, each of said input processors including gain control means, and
for each component a master processor including
means for combining the corresponding components of different ones of the audio signals from the input processors,
means responsive to the magnitude of the signal at the output of the master processor for generating a level error signal corresponding to the amount the magnitude of the output signal of the master processor exceeds a predetermined maximum level, and
means responsive to the level error signal for adjusting the gains of the respective input processors in proportion to the relative magnitudes of the audio signals at the outputs of the input processors, and
means for combining the outputs of the master processors to provide an audio output signal.

32. The system of claim 31 wherein the means for dividing the input signals into components includes frequency sensitive means for dividing input signals into components of different frequency ranges.

33. The system of claim 31 including at least one digital signal processor.

* * * * *